United States Patent
Nishiyama

(10) Patent No.: US 7,786,707 B2
(45) Date of Patent: Aug. 31, 2010

(54) OSCILLATOR CIRCUIT

(75) Inventor: Yoshinobu Nishiyama, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 631 days.

(21) Appl. No.: 11/798,934

(22) Filed: May 17, 2007

(65) Prior Publication Data
US 2007/0273344 A1 Nov. 29, 2007

(30) Foreign Application Priority Data
May 17, 2006 (JP) ............................. 2006-137378

(51) Int. Cl.
*H02J 7/00* (2006.01)
(52) U.S. Cl. ....................... 320/166; 320/158
(58) Field of Classification Search .................. 320/163, 320/166, 158, 133; 323/265, 323
See application file for complete search history.

(56) References Cited

U.S. PATENT DOCUMENTS 6,078,208 A * 6/2000 Nolan et al. ................. 327/512
2005/0007201 A1* 1/2005 Lee et al. ...................... 331/16

FOREIGN PATENT DOCUMENTS

JP 2003-069341 3/2003

* cited by examiner

*Primary Examiner*—Edward Tso
*Assistant Examiner*—Aaron Piggush
(74) *Attorney, Agent, or Firm*—Morrison & Foerster LLP

(57) ABSTRACT

The invention provides an oscillator circuit that reduces the dependence of an oscillation frequency on a power supply voltage. When a first charging and discharging circuit completes its discharge, a terminal voltage of a first capacitor of the first charging and discharging circuit is initialized to a power supply voltage and simultaneously a second charging and discharging circuit starts its discharge. Then, when the second charging and discharging circuit completes its discharge, a terminal voltage of a second capacitor of the second charging and discharging circuit is initialized to the power supply voltage and simultaneously the first charging and discharging circuit starts its discharge. The first and second charging and discharging circuits alternately repeat the initialization and the discharge, and the discharge is always started from the power supply voltage.

10 Claims, 5 Drawing Sheets reference current circuit | first charging and discharging circuit reference current circuit | second charging and discharging circuit

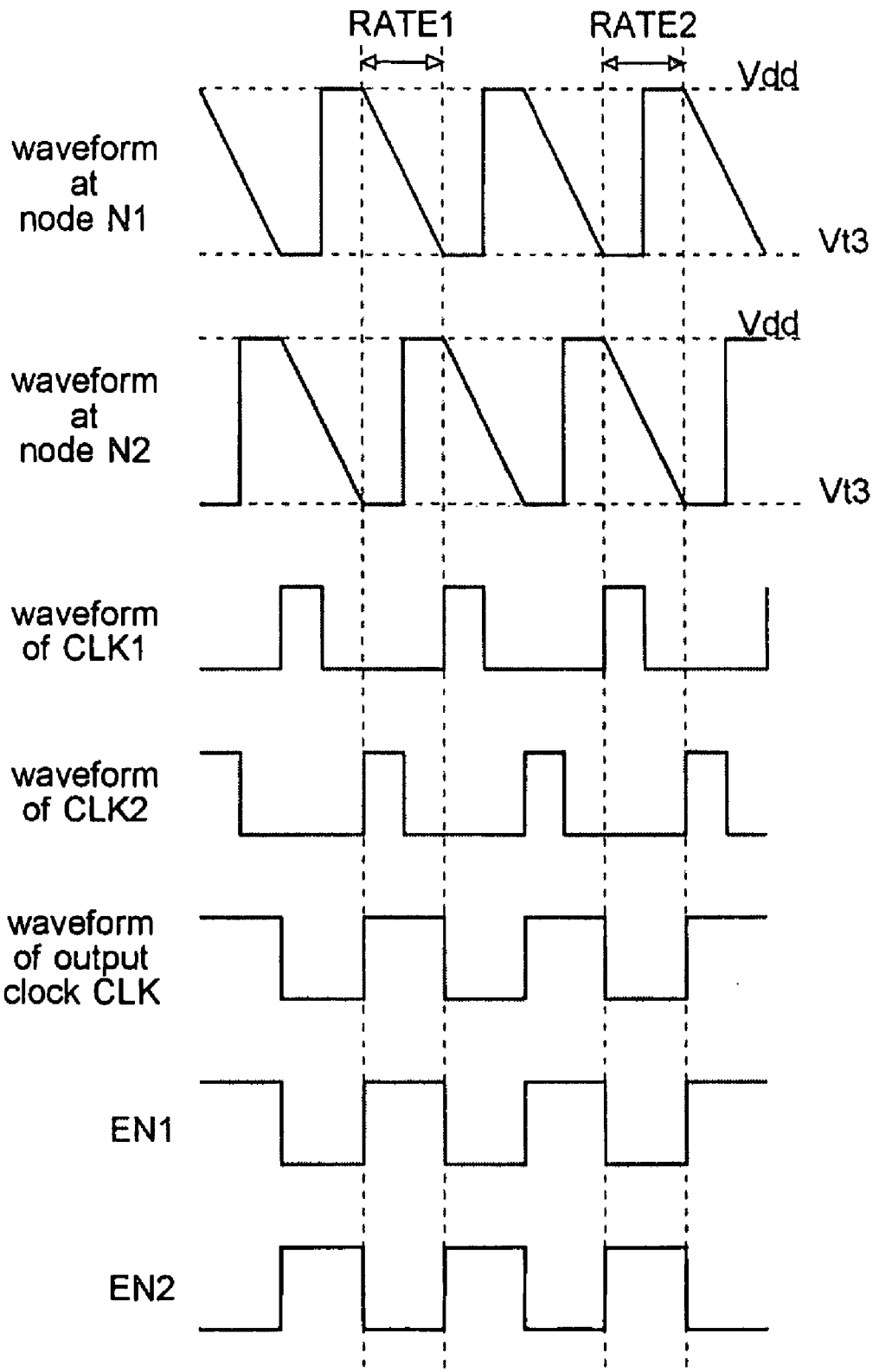

reference current circuit | first charging and discharging circuit

OSCILLATOR CIRCUIT

CROSS-REFERENCE OF THE INVENTION

This application claims priority from Japanese Patent Application No. 2006-137378, the content of which is incorporated herein by reference in its entirety.

BACKGROUND OF THE INVENTION

1. Field of the Invention

The invention relates to an oscillator circuit, particularly to an oscillator circuit generating an oscillation output by charging and discharging a capacitor.

2. Description of the Related Art

Generally, an oscillator circuit is incorporated in a semiconductor integrated circuit such as a microcomputer in order to generate an operation clock. Hereafter, a conventional oscillator circuit will be described. FIG. 5 is a circuit diagram of the oscillator circuit.

This oscillator circuit includes a capacitor C, a Schmidt inverter STV detecting a voltage of a node N of the capacitor C, a P-channel type MOS transistor M1 and an N-channel type MOS transistor M2 where an output of the Schmidt inverter STV is inputted to respective gates through an inverter INV, a P-channel type MOS transistor M3 serially connected with the P-channel type MOS transistor M1 and flowing a reference current I1, and an N-channel type MOS transistor M4 serially connected with the N-channel type MOS transistor M2 and flowing a reference current I1. An output clock of the oscillator circuit is obtained from the inverter INV.

FIG. 6 is a circuit diagram showing a reference current circuit generating the above-mentioned reference current I1. A resistor R1 (a resistance value R1) and an N-channel type MOS transistor M5 are serially connected between a power supply terminal supplying a power supply voltage Vdd and a ground terminal supplying a ground voltage GND. In the N-channel type MOS transistor M5, a gate and a drain are commonly connected and a source is grounded. When a voltage between the gate and the source is Vgs1, the reference current I1 flows through the N-channel type MOS transistor M5. The reference current I1 is given by the equation 1.

$$I1 = \frac{Vdd - Vgs1}{R1} \qquad \text{[Equation 1]}$$

This reference current I1 flows through an N-channel type MOS transistor M6 of a current mirror. The reference current I1 also flows through a P-channel type MOS transistor M7 serially connected with the N-channel type MOS transistor M6.

A gate voltage Va of the P-channel type MOS transistor M7 is applied to a gate of the P-channel type MOS transistor M3 in FIG. 5, and a gate voltage Vb of the N-channel type MOS transistor M6 is applied to a gate of the N-channel type MOS transistor M4 in FIG. 5.

The operation of this oscillator circuit will be described referring to a waveform diagram in FIG. 7. It is assumed that the Schmidt inverter STV has two thresholds Vt1 and Vt2 (Vt1>Vt2). When the voltage of the node N (a terminal of the capacitor C) is increased and reaches the threshold Vt1 of the Schmidt inverter STV by charging the capacitor C by the reference current I1, an output of the Schmidt inverter STV is inverted to the low level, an output of the inverter INV turns to the high level, and correspondingly M2 turns on and M1 turns off. The voltage of the node N of the capacitor C is then decreased by discharging the capacitor C by the reference current I1, and when the voltage reaches the threshold Vt2 of the Schmidt inverter STV, the output of the Schmidt inverter STV is inverted to the high level, the output of the inverter INV turns to the low level, and correspondingly M2 turns off and M1 turns on. Then, the charging of the capacitor C by the reference current I1 is started again. By repeating the charge and the discharge in this manner, the output clock is obtained from the inverter INV. The relevant technology is described in the Japanese Patent Application Publication No. 2003-69341.

It is preferable that the oscillation frequency of the oscillator circuit incorporated in the semiconductor integrated circuit does not change even when the power supply voltage Vdd applied to the semiconductor integrated circuit changes due to deterioration of a battery or the like. However, the conventional oscillator circuit has a problem of high dependence of the oscillation frequency on the power supply voltage.

SUMMARY OF THE INVENTION

The invention provides an oscillator circuit including: a reference current circuit generating a reference current; a first charging and discharging circuit comprising a first capacitor, a first switching circuit switching between an initializing operation initializing a terminal voltage of the first capacitor to a power supply voltage and a discharging operation flowing the reference current to the first capacitor, and a first detection circuit detecting the terminal voltage of the first capacitor and outputting a first clock based on the detection; a second charging and discharging circuit comprising a second capacitor, a second switching circuit switching between an initializing operation initializing a terminal voltage of the second capacitor to the power supply voltage and a discharging operation flowing the reference current to the second capacitor, and a second detection circuit detecting the terminal voltage of the second capacitor and outputting a second clock based on the detection; and a control circuit controlling the first and second switching circuits so that the first and second charging and discharging circuits alternately perform the initializing operation and the discharging operation in response to the first and second clocks.

In the invention, when the first charging and discharging circuit completes its discharge, the terminal voltage of the first capacitor of the first charging and discharging circuit is initialized to the power supply voltage and simultaneously the second charging and discharging circuit starts its discharge. Then, when the second charging and discharging circuit completes its discharge, the terminal voltage of the second capacitor of the second charging and discharging circuit is initialized to the power supply voltage and simultaneously the first charging and discharging circuit starts its discharge. In this manner, the first and second charging and discharging circuits alternately repeat the initialization and the discharge, and the discharge is always started from the power supply voltage. This reduces the dependence of an oscillation frequency on the power supply voltage.

Furthermore, the same effect is obtained by setting the voltage to be initialized to the ground voltage instead of to the power supply voltage and starting charging the capacitor from the ground voltage.

BRIEF DESCRIPTION OF THE DRAWINGS

FIG. 3 is an operation waveform diagram of the oscillator circuit of the first embodiment of the invention.

DETAILED DESCRIPTION OF THE INVENTION

Figure 1:
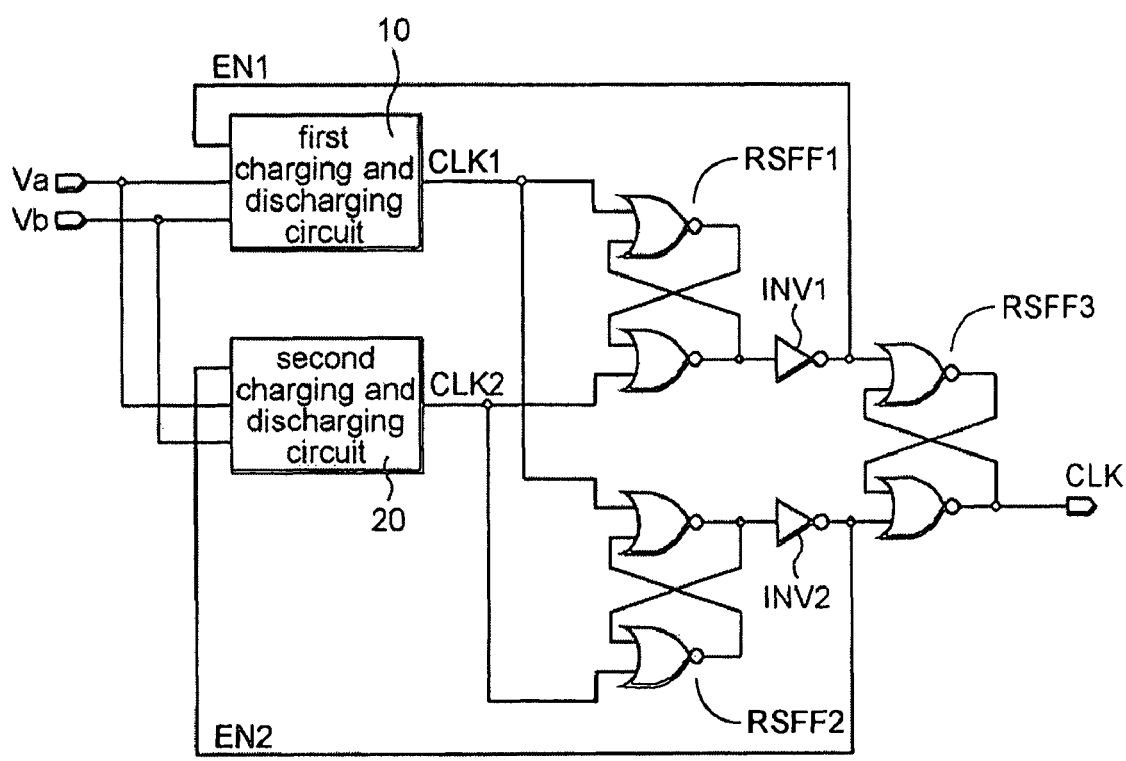
FIG. 1 is a circuit diagram of an oscillator circuit of a first embodiment of the invention.
Figure 2A:
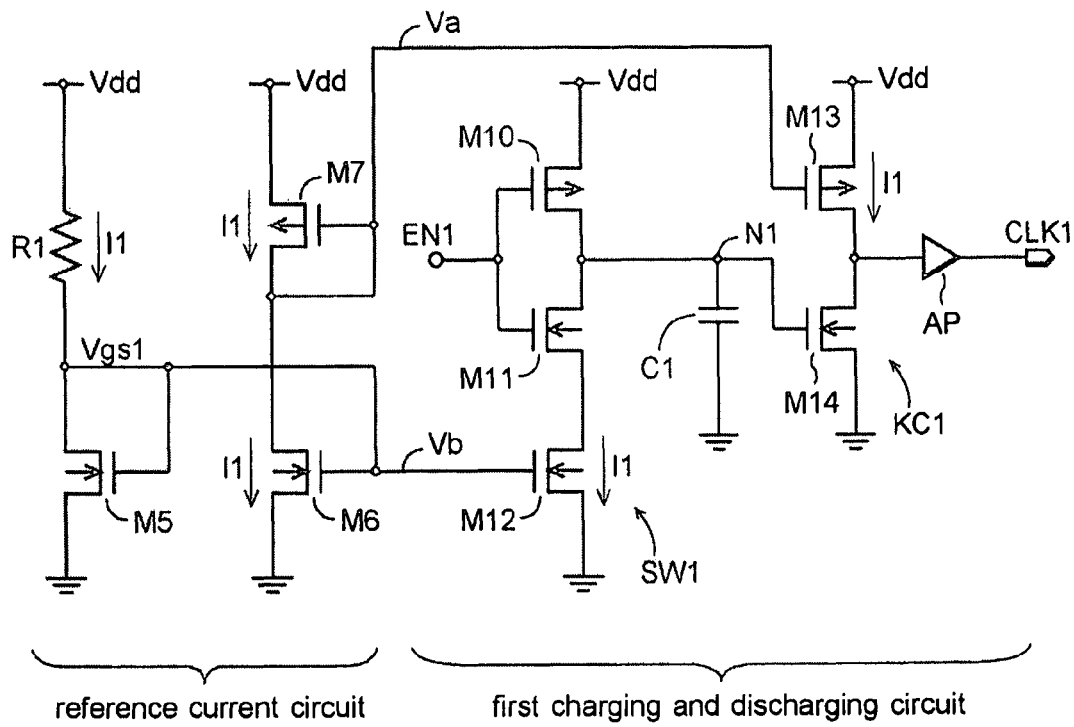
FIGS. 2A and 2B are circuit diagrams of first and second charging and discharging circuits of the oscillator circuit of the first embodiment of the invention.
Figure 2B:
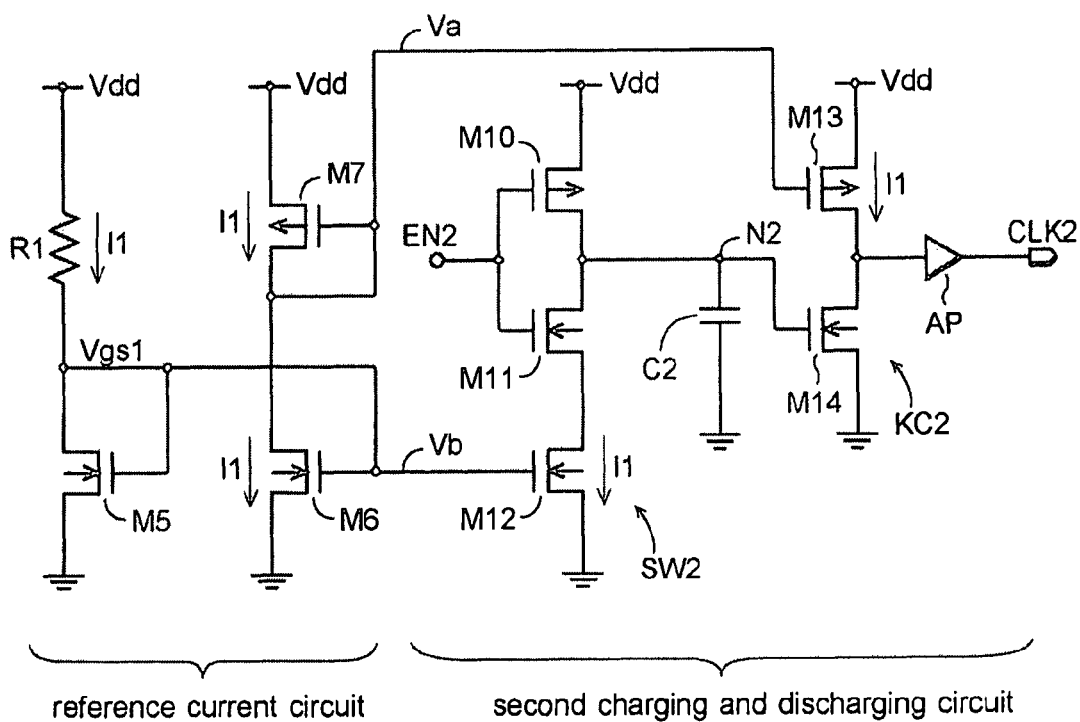

An oscillator circuit of a first embodiment of the invention will be described referring to FIGS. 1 to 3. FIG. 1 is a circuit diagram of the oscillator circuit. FIG. 2A is a circuit diagram of a first charging and discharging circuit 10, and FIG. 2B is a circuit diagram of a second charging and discharging circuit 20.

The first charging and discharging circuit 10 and the second charging and discharging circuit 20 output a first clock CLK1 and a second clock CLK2 respectively when discharge is completed. The first clock CLK1 and the second clock CLK2 are inputted to set terminals and reset terminals of a first RS (set-rest input type) flip-flop RSFF1 and a second RS flip-flop RSFF2, respectively.

An output of the first RS flip-flop RSFF1 is fed back as a first discharge enable signal EN1 to a first switching circuit SW1 of the first charging and discharging circuit 10 and also inputted to a set terminal of a third RS flip-flop RSFF3 through an inverter INV1. Similarly, an output of the second RS flip-flop RSFF2 is fed back as a second discharge enable signal EN2 to a second switching circuit SW2 of the second charging and discharging circuit 20 and also inputted to a reset terminal of the third RS flip-flop RSFF3 through an inverter INV2.

Figure 6:
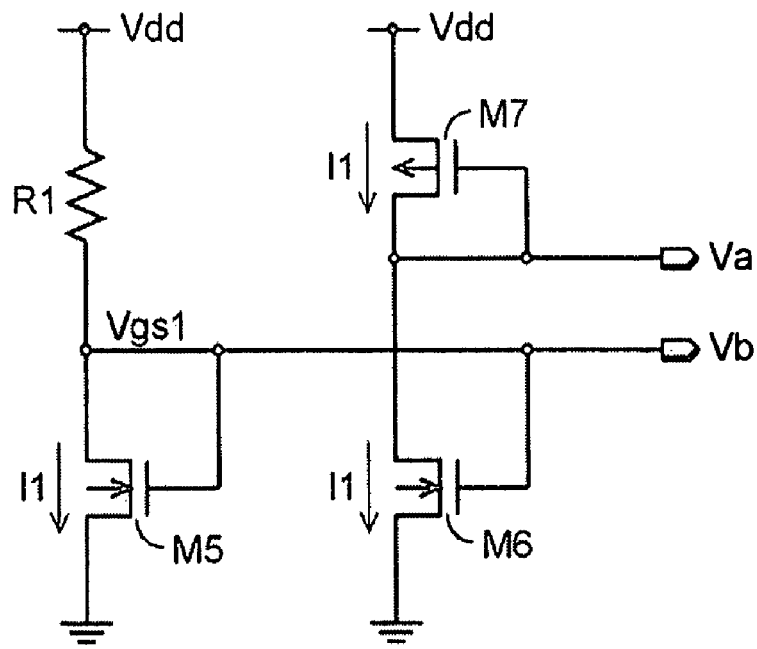
FIG. 6 is a circuit diagram of a reference current circuit.
Figure 7:
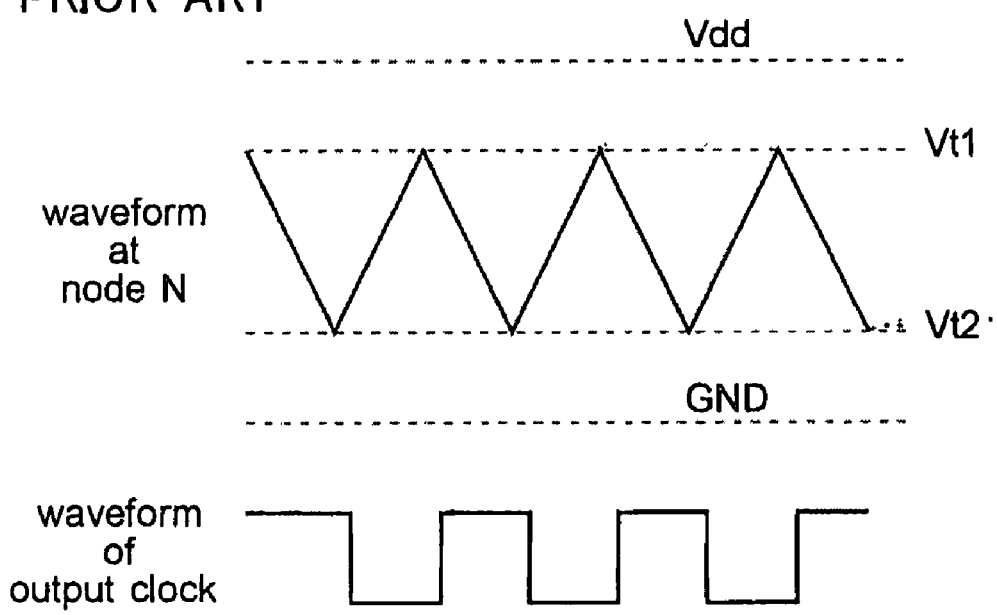
FIG. 7 is an operation waveform diagram of the conventional oscillator circuit.

The first charging and discharging circuit 10 includes a first capacitor C1, a first switching circuit SW1 and a first detection circuit KC1 as shown in FIG. 2A. The first switching circuit SW1 includes a P-channel type MOS transistor M10 and an N-channel type MOS transistor M11 forming an inverter, and an N-channel type MOS transistor M12 serially connected to these transistors and flowing a reference current I1 generated by a reference current circuit. The reference current circuit is the same circuit as the circuit shown in FIG. 6. The first discharge enable signal EN1 is inputted to the inverter.

An output of the first switching circuit SW1 is connected with a terminal (a node N1) of the first capacitor C1 and inputted to the first detection circuit KC1. The first detection circuit KC1 is a kind of inverter, and includes a P-channel type MOS transistor M13 and an N-channel type MOS transistor M14 that are serially connected. A voltage Va of the reference current circuit is applied to a gate of the P-channel type MOS transistor M13 to flow the reference current I1. The output of the first switching circuit SW1 is applied to a gate of the N-channel type MOS transistor M14. Therefore, a threshold Vt3 of the first detection circuit KC1 is set to an equal value to Vgs1 of the reference current circuit (Vt3=Vgs1). An output of the first detection circuit KC1 is applied to a buffer amplifier AP, and an output of the buffer amplifier AP is outputted as the first clock CLK1.

The second charging and discharging circuit 20 has the same circuit structure as the first charging and discharging circuit 10 as shown in FIG. 2B although the second discharge enable signal EN2 is inputted to the second switching circuit SW2 of the second charging and discharging circuit 20.

Next, the operation of this oscillator circuit will be described referring to FIG. 3. Assuming that the first discharge enable signal EN1 is high and the second discharge enable signal EN2 is low, in the first charging and discharging circuit 10, M10 turns off, M11 turns on, and the first capacitor C1 is discharged by the reference current I1. On the other hand, during the discharging operation of the first charging and discharging circuit 10, the second charging and discharging circuit 20 is initialized. In detail, the second capacitor C2 of the second charging and discharging circuit 20 is charged by the second switching circuit SW2, and a voltage of a terminal (a node N2) of the second capacitor C2 is initialized to a power supply voltage Vdd.

When the node N1 of the first capacitor C1 is decreased from the power supply voltage Vdd to Vt3 by the discharge, the output of the first detection circuit KC1 is inverted to the high level and the first clock CLK1 turns to the high level. Then, the outputs of the first RS flip-flop RSFF1 and the second RS flip-flop RSFF2 are inverted, and the first discharge enable signal EN1 turns to the low level and simultaneously the second discharge enable signal EN2 turns to the high level.

When the first discharge enable signal EN1 turns to the low level, in the first charging and discharging circuit 10, M10 turns on and M11 turns off in the first switching circuit SW1, so that the first capacitor C1 is charged and the voltage of the node N1 is initialized to the power supply voltage Vdd.

When the second discharge enable signal EN2 turns to the high level, in the second charging and discharging circuit 20, the second capacitor C2 starts being discharged by the reference current I1. Namely, during the discharging operation of the second charging and discharging circuit 20, the second charging and discharging circuit 10 is initialized. When the node N2 of the second capacitor C2 is decreased from the power supply voltage Vdd to Vt3, the output of the second detection circuit KC2 is inverted to the high level and the second clock CLK2 turns to the high level. Then, the second discharge enable signal EN2 turns to the low level and simultaneously the first discharge enable signal EN1 turns to the high level again, and the first charging and discharging circuit 10 starts the discharging operation and the second charging and discharging circuit 20 is initialized.

In this manner, the first charging and discharging circuit 10 and the second charging and discharging circuit 20 alternately repeat the initialization and the discharge and the discharge is always started from the power supply voltage Vdd. This reduces the dependence of an oscillation frequency on the power supply voltage. Since the initial voltages of the nodes N1 and N2 are always at the power supply voltage Vdd, time t necessary for one discharge is given by the equation 2.

$$t = \frac{C1 \times (Vdd - Vt3)}{I1} \quad \text{[Equation 2]}$$

Here, since the reference current I1 is given by the equation 1, the equation 3 is obtained by substituting this for I1 in the equation 2.

$$t = \frac{C1 \times R1 \times (Vdd - Vt3)}{Vdd - Vgs1} \quad \text{[Equation 3]}$$

Here, by setting Vt3=Vgs1 as described above, the dependence of time t on the power supply voltage is cancelled as shown by the equation 4.

$$t = C1 \times R1 \qquad \text{[Equation 4]}$$

While the output clock CLK is obtained from the third RS flip-flop RSFF3, since the high and low cycle of the output clock CLK depends on the discharge cycles of the first charging and discharging circuit 10 and the second charging and discharging circuit 20, the duty cycle of the output clock CLK is accurately 50% even without a counter by setting the CR time constants of the first charging and discharging circuit 10 and the second charging and discharging circuit equally (C1×R1=C2×R2).

Figure 4:
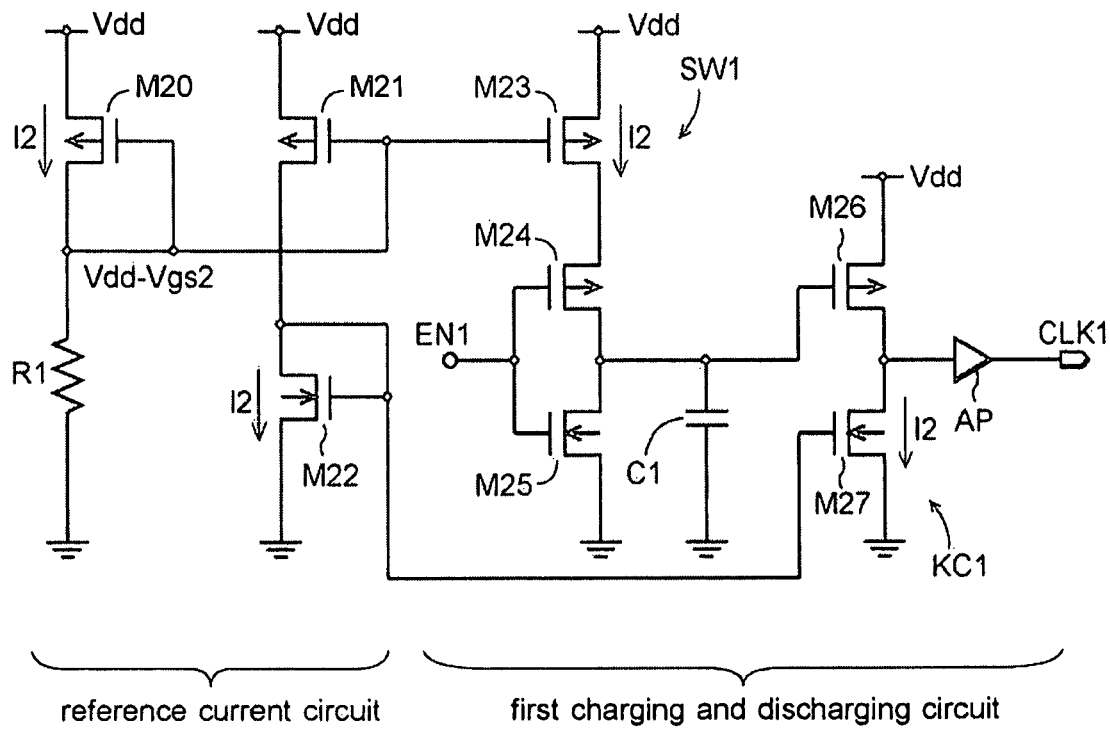
FIG. 4 is a circuit diagram of an oscillator circuit of a second embodiment of the invention.
Figure 5:
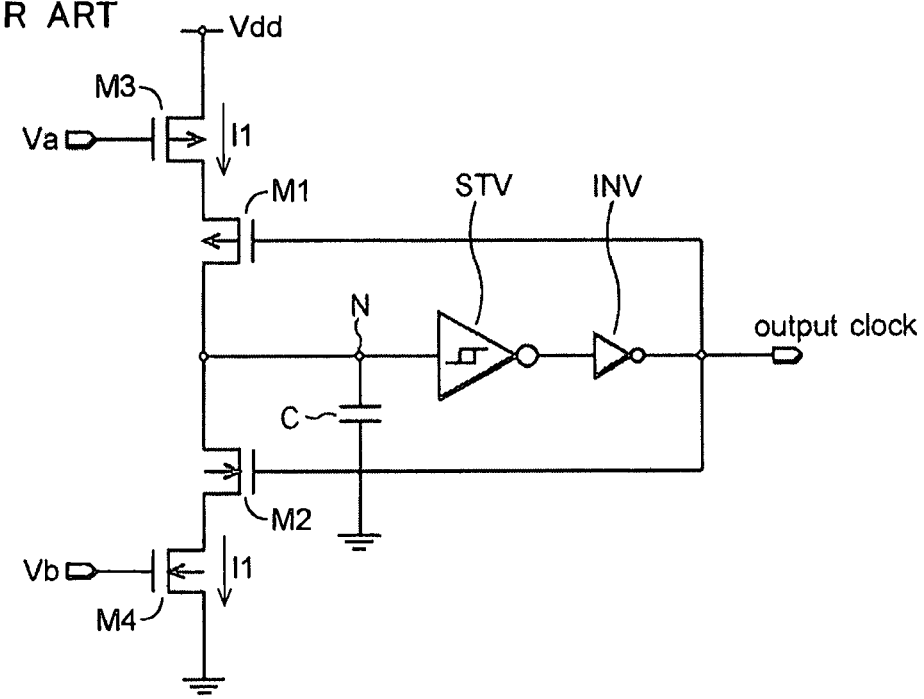
FIG. 5 is a circuit diagram of a conventional oscillator circuit.

Next, an oscillator circuit of a second embodiment of the invention will be described. While the first embodiment is described on the circuit that initializes the voltage to the power supply voltage Vdd and performs the discharge, the same effect is obtained by a circuit that initializes the voltage to the ground voltage GND and performs charge. In this case, the first charging and discharging circuit is configured as shown in FIG. 4. The second charging and discharging circuit is also configured similarly. In FIG. 4, a reference current circuit has transistors of which the polarities are inverted, and includes P-channel type MOS transistors M20 and M21 and an N-channel type MOS transistor M22.

A first switching circuit SW1 includes a P-channel type MOS transistor M23 flowing a reference current I2 supplied from the reference current circuit, and a P-channel type MOS transistor M24 and an N-channel type MOS transistor M25 forming an inverter. Here, the reference current I2 is given by the equation 5.

$$I2 = \frac{Vdd - Vgs2}{R1} \qquad \text{[Equation 5]}$$

A first detection circuit KC1 includes a P-channel type MOS transistor M26 and an N-channel type MOS transistor M27 that are serially connected. The N-channel type MOS transistor M27 forms a current mirror with the N-channel type MOS transistor M22 of the reference current circuit, and the reference current I2 flows therethrough. An output of the first switching circuit SW1 is applied to a gate of the P-channel type MOS transistor M26. Therefore, a threshold Vt3 of the first detection circuit KC1 is set to an equal value to Vgs2 of the reference current circuit. With this structure, the first and second charging and discharging circuits alternately repeat the initialization and the charge, and the charge is always started from the ground voltage GND. This reduces the dependence of the oscillation frequency on the power supply voltage in the similar manner to the first embodiment.

What is claimed is:

1. An oscillator circuit comprising:
a reference current circuit generating a reference current;
a first charging and discharging circuit comprising a first capacitor, a first switching circuit switching the first charging and discharging circuit from an initializing operation initializing a voltage of a terminal of the first capacitor to a power supply voltage and to a discharging operation allowing the reference current to flow from the first capacitor and switching the first charging and discharging circuit from the discharging operation to the initializing operation, and a first detection circuit detecting the voltage of the terminal of the first capacitor and outputting a first clock based on the detection;
a second charging and discharging circuit comprising a second capacitor, a second switching circuit switching the second charging and discharging circuit from an initializing operation initializing a voltage of a terminal of the second capacitor to a power supply voltage and to a discharging operation allowing the reference current to flow from the second capacitor and switching the second charging and discharging circuit from the discharging operation to the initializing operation, and a second detection circuit detecting the voltage of the terminal of the second capacitor and outputting a second clock based on the detection; and
a control circuit controlling the first and second switching circuits so that the first and second charging and discharging circuits alternately perform corresponding initializing operations and the discharging operations in response to the first and second clocks,
wherein the reference current circuit comprises a resistor and a first MOS transistor serially connected between a power supply terminal and a ground terminal,
a gate of the first MOS transistor is connected to a drain of the first MOS transistor,
the first detection circuit comprises a second MOS transistor serially connected between the power supply terminal and the ground terminal and comprising a gate connected to the terminal of the first capacitor, and
the first detection circuit has a threshold voltage equal to a voltage applied between a source of the first MOS transistor and the connected gate and drain of the first MOS transistor.

2. The oscillator circuit of claim 1, wherein the second detection circuit comprises a third MOS transistor serially connected between the power supply terminal and the ground terminal and comprising a gate connected to the terminal of the second capacitor, and the second detection circuit has a threshold voltage equal to the voltage applied between the source of the first MOS transistor and the connected gate and drain of the first MOS transistor.

3. The oscillator circuit of claim 1, wherein the control circuit comprises a first and a second RS flip-flops to which detection outputs of the first and second detection circuits are inputted, respectively, and an output of the first RS flip-flop is applied to the first switching circuit and an output of the second RS flip-flop is applied to the second switching circuit.

4. The oscillator circuit of claim 1, wherein each of the first and second detection circuits comprises an inverter.

5. The oscillator circuit of claim 1, wherein the control circuit is configured to control the first and second switching circuits so that the second charging and discharging circuit performs the initializing operation while the first charging and discharging circuit performs the discharging operation and that the first charging and discharging circuit performs the initializing operation while the second charging and discharging circuit performs the discharging operation.

6. An oscillator circuit comprising:
a reference current circuit generating a reference current;
a first charging and discharging circuit comprising a first capacitor, a first switching circuit switching the first charging and discharging circuit from an initializing operation initializing a voltage of a terminal of the first capacitor to a ground voltage and to a charging operation allowing the reference current to flow to the first capacitor and switching the first charging and discharging circuit from the discharging operation to the initializing operation, and a first detection circuit detecting the voltage of the terminal of the first capacitor and outputting a first clock based on the detection;

a second charging and discharging circuit comprising a second capacitor, a second switching circuit switching the second charging and discharging circuit from an initializing operation initializing a voltage of a terminal of the second capacitor to a ground voltage and to a charging operation allowing the reference current to flow to the second capacitor and switching the second charging and discharging circuit from the discharging operation to the initializing operation, and a second detection circuit detecting the voltage of the terminal of the second capacitor and outputting a second clock based on the detection; and a control circuit controlling the first and second switching circuits so that the first and second charging and discharging circuits alternately perform corresponding initializing operations and corresponding charging operations in response to the first and second clocks, wherein the reference current circuit comprises a resistor and a first MOS transistor serially connected between a power supply terminal and a ground terminal, a gate of the first MOS transistor is connected to a drain of the first MOS transistor, the first detection circuit comprises a second MOS transistor serially connected between the power supply terminal and the ground terminal and comprising a gate connected to the terminal of the first capacitor, and the first detection circuit has a threshold voltage equal to a voltage applied between a source of the first MOS transistor and the connected gate and drain of the first MOS transistor.

7. The oscillator circuit of claim 6, wherein the second detection circuit comprises a third MOS transistor serially connected between the power supply terminal and the ground terminal and comprising a gate connected to the terminal of the second capacitor, and the second detection circuit has a threshold voltage equal to the voltage applied between the source of the first MOS transistor and the connected gate and drain of the first MOS transistor.

8. The oscillator circuit of claim 6, wherein the control circuit comprises a first and a second RS flip-flops to which detection outputs of the first and second detection circuits are inputted, respectively, and an output of the first RS flip-flop is applied to the first switching circuit and an output of the second RS flip-flop is applied to the second switching circuit.

9. The oscillator circuit of claim 6, wherein each of the first and second detection circuits comprises an inverter.

10. The oscillator circuit of claim 6, wherein the control circuit is configured to control the first and second switching circuits so that the second charging and discharging circuit performs the initializing operation while the first charging and discharging circuit performs the charging operation and that the first charging and discharging circuit performs the initializing operation while the second charging and discharging circuit performs the charging operation.

* * * * *